United States Patent

Sachdev

[11] Patent Number: 5,969,653
[45] Date of Patent: Oct. 19, 1999

[54] TESTING CONTROL SIGNALS IN A/D CONVERTERS

[75] Inventor: Manoj Sachdev, Eindhoven, Netherlands

[73] Assignee: U.S. Philips Corporation, New York, N.Y.

[21] Appl. No.: 08/951,036

[22] Filed: Oct. 15, 1997

[30] Foreign Application Priority Data

Oct. 16, 1996 [EP] European Pat. Off. ............ 96202881

[51] Int. Cl.⁶ .................................................. H03M 1/10
[52] U.S. Cl. ............................................ 341/120; 341/118
[58] Field of Search ................................ 341/120, 118, 341/144, 155

[56] References Cited

U.S. PATENT DOCUMENTS

| | | | |
|---|---|---|---|
| 4,251,881 | 2/1981 | Ruether et al. | 370/98 |
| 4,580,126 | 4/1986 | Kato et al. | 341/120 |
| 4,667,296 | 5/1987 | Crowe | 364/553 |
| 5,225,834 | 7/1993 | Imai et al. | 341/120 |
| 5,305,003 | 4/1994 | Han | 341/120 |
| 5,389,926 | 2/1995 | Fukushima . | |
| 5,659,312 | 8/1997 | Sunter et al. | 341/120 |

*Primary Examiner*—Brian Young
*Assistant Examiner*—Peguy JeanPierre
*Attorney, Agent, or Firm*—Brian J. Wieghaus

[57] ABSTRACT

The invention relates to an integrated circuit, containing an A/D converter and a test circuit, the latter in a test mode enabling explicit testing of analog and digital control signals of the circuit by supplying these control signals to circuit sections of the A/D converter and thus generating digital data signals at the output of the A/D converter. Analog signals, like bias signals and reference signals, can be selected and supplied to the input facility of the converter. Subsequently, a digital representation of the selected signal is obtained at the output facility of the converter. Digital signals, like clock signals, can be selected and supplied directly to the output facility. The output facility is operated by a clock signal and constructs a clocked version of the selected digital signal, which is subsequently available at the output. Thus, selected signals, either digital or analog, are available at the output of the converter and can be compared to specified data.

17 Claims, 2 Drawing Sheets

TESTING CONTROL SIGNALS IN A/D CONVERTERS

BACKGROUND OF THE INVENTION

The invention relates to an integrated circuit containing an A/D converter and a test circuit, the operation of said A/D converter being under control of a plurality of analog and digital control signals, one of the latter being a clock signal, said A/D converter including an input facility for receiving an analog input signal, analog signal comparison means connected to the input facility for comparing the analog input signal with a number of reference values and thus generating respective elements of a digital sequence, digital conversion means connected to the analog signal comparison means for converting the digital sequence to a first digital data signal, and a digital output facility that is controlled by the clock signal and connected to the digital conversion means for outputting the first digital data signal.

In view of the importance of the A/D converter for the overall performance of the system of which the converter forms a part, thorough testing of this component is required. The operation of an A/D converter is controlled by a set of time-variant and time-invariant control signals. These control signals, also designated the control path, consist of reference signals, bias signals, clock signals, etc. For proper operation of the converter, these control signals are required to match certain specifications. This is tested only implicitly with functional (data path) testing. Explicit testing of the control path could detect defects and faults that would otherwise escape detection. To make explicit testing feasible, a Design for Testability (DfT) solution is necessary, since the control path is generally not accessible for measurement. In U.S. Pat. No. 5,389,926 a set-up has been disclosed, featuring a test circuit, coupled to an A/D converter. This test circuit is activated in a test mode to connect a terminal to an output node of an internal circuit section of the converter, which has a function of generating a changeable reference voltage at that output node. The magnitude of the thus generated reference voltage can be monitored on the terminal. This set-up, however, does not provide a way for digital on-chip testing of the control signals of the A/D converter.

SUMMARY OF THE INVENTION

It is, inter alia, an object of the invention to provide a solution to the problem of how to achieve digital on-chip testing of A/D converter control signals.

To this end, the invention procures a circuit as specified in the preamble, characterized in that said test circuit has a test mode for selecting at least one of said control signals to be supplied to one of said facilities, thus outputting a second digital data signal at the digital output facility representing the selected control signal for a subsequent test. By having this information available in digital form at the digital output facility, the testing can take place on-chip. Hereto, for example, an on-chip dedicated tester circuit or a CPU running a test program should be provided, that would carry out the comparison of the generated digital data signal at the digital output facility, derived from selected control signals, with specified data stored in a memory. To save memory, the comparison could also involve compressed signals, the compression of the digital data signal being performed on-chip by, for example, a linear feedback shift register.

According to an aspect of the invention, said test circuit enables selecting a first selected signal from said analog control signals, and supplying that first selected signal to the input facility, thus providing a third digital data signal at the digital output facility corresponding to an analog magnitude of the first selected signal. An advantage hereof is that analog control signals do not have to be taken off the chip for testing. Accurate off-chip testing of analog signals is not a trivial task, as a result of degradation of the signal on its long way to the off-chip test equipment, especially caused by interference from nearby digital signals. Moreover, off-chip testing of analog signals requires expensive test equipment. The invention solves these problems by converting the selected analog control signals to respective corresponding digital data signals and making them available for evaluation.

According to an aspect of the invention, said test circuit also enables selecting a second selected signal from said digital control signals, and supplying that second selected signal to the digital output facility that is controlled by the clock signal, and thereby producing a fourth digital data signal at the digital output facility representative of the timing characteristics of the second selected signal relative to the clock signal. In this way, a straightforward way to test digital control signals is provided. The critical aspects of digital control signals, notably clock signals, are above all their mutual timing relationships. As a result of unavoidable signal delay, these timing relationships are hard to preserve by linking these control signals to far-away terminals and even farther away test equipment for monitoring. According to an aspect of the invention, this problem is circumvented by "freezing" the delay-sensitive timing aspects of the selected digital control signal in a corresponding digital data signal, that is subsequently used for evaluation.

It will now be clear that the invention provides a coherent way for on-chip digital testing of either analog or digital control signals of the A/D converter, making use as much as possible of components that are required anyway for the analog-to-digital conversion process. Nonetheless, the invention is also advantageous for off-chip testing, as the control signals, both analog and digital, are packaged in a more robust format. To make the digital data signals available at an output port of the chip, use could be made of a scan chain to shift the digital data signal to the output port. Embedded A/D converters are, in many cases, anyway provided with a scan chain to allow functional testing, independently from other components of the circuit.

Another aspect of the invention is that, in the same manner as described above, also externally generated analog signals can be tested. This is realized by extending said test circuit of the converter to enable selecting an analog external signal, carried by a node external to the converter, and supplying that analog external signal to the input facility, thereby producing a sixth digital data signal at the digital output facility representative of an analog magnitude of the analog external signal relative to the clock signal.

According to another aspect of the invention also externally generated digital signals can be tested. This is realized by extending said test circuit of the converter to enable selecting a digital external signal, carried by a node external to the converter, and supplying that digital external signal to the digital output facility that is controlled by the clock signal, thereby producing a seventh digital data signal at the digital output facility representative of the timing characteristics of the digital external signal relative to the clock signal. The latter two aspects greatly raise the number of signals that can be tested. Notably analog and digital signals that control analog signal processing stages preceding the analog-to-digital conversion, like filter and sample-and-hold circuits, are candidates for explicit testing after the manner of the invention.

According to another aspect of the invention, the timing relationship between subsets of digital signals, can be tested in a fast and simple way. This is realized by providing said test circuit with a multiple input logic circuit for at once receiving a subset of the digital control signals and the digital external signals, rendering one pulse train at the output of the logic circuit containing required timing information of the subset, the test circuit enabling selection of that pulse train for transfer to the digital output facility that is controlled by the clock, and thereby producing a ninth digital data signal at the digital output facility representative of the relative timing characteristics of the subset. Then, this data can be interpreted against predetermined timing relationship data.

Relevant material to the present invention can be found in U.S. patent applications U.S. Ser. Nos. 08/532338, 08/679871 and 08/616083, assigned to the present applicant.

The invention also relates to a method of testing of a circuit according to the invention.

BRIEF DESCRIPTION OF THE DRAWING

The invention is further explained below by way of example, with reference to the accompanying drawing.

DETAILED DESCRIPTION OF THE PREFERRED EMBODIMENTS

Figure 1:
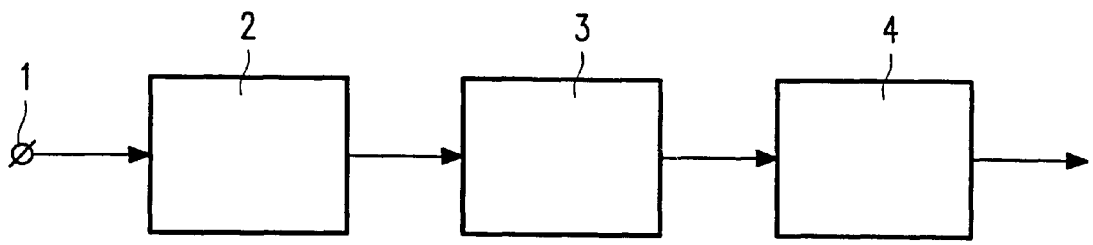
FIG. 1 gives a block diagram of an A/D converter of arbitrary type.

FIG. 1 shows a block diagram of an A/D converter of an arbitrary type. Both full-flash and folding converters, as well as most other known types of A/D converters fit into this block diagram. To input terminal 1, the analog signal that is to be converted is applied. The analog signal comparison circuit 2 generate a digital sequence, being a digital representation of the magnitude of the analog signal applied to the input terminal. In principle, also the magnitude of a signal that is interpreted throughout the A/D circuit as a digital signal could be converted in the same manner. The format of the digital sequence and the way the sequence is obtained are determined by the converter type. Subsequently, the digital conversion circuit 3 convert the digital sequence to a digital data signal of a required format. This could mean a serial-to-parallel conversion, like in a capacitor/resistor-type converter, or a conversion from a thermometer code to a binary code, like in a full-flash converter. The digital data sequence is subsequently outputted by the digital output facility 4. To allow conventional data path testing, normally hardware to read out the digital output facility is provided, for example a scan chain for shifting out the data to the outside of the electronic circuit via an output port.

Figure 2:
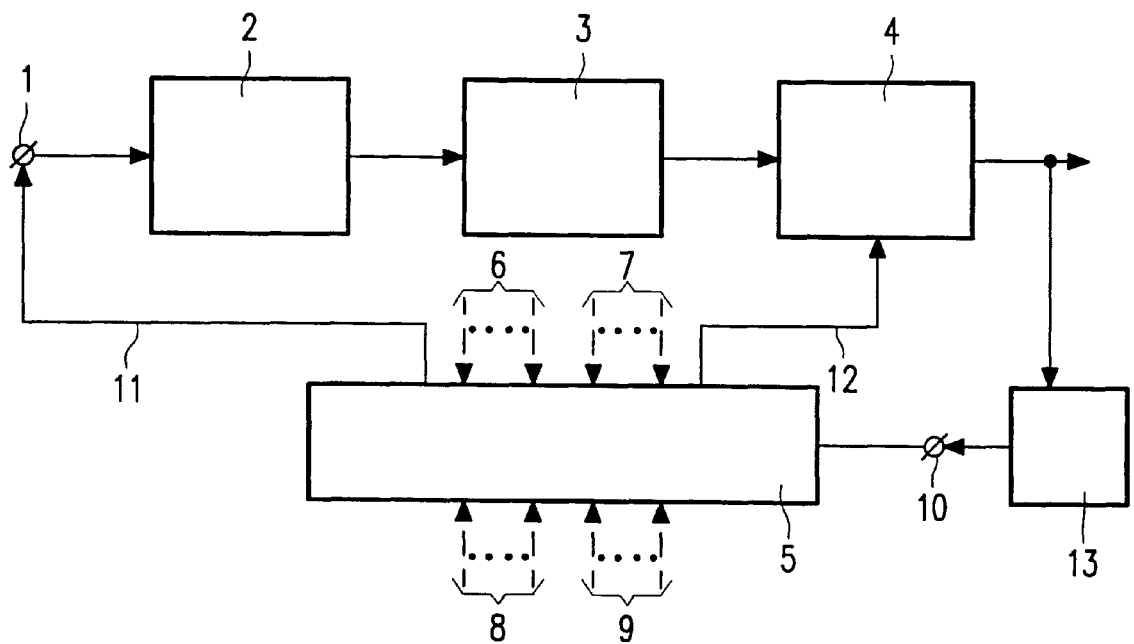
FIG. 2 gives a block diagram of an A/D converter according to the invention, based on the A/D converter of FIG. 1.

FIG. 2 shows an A/D converter according to the invention and a tester 13, for carrying out the testing. The A/D converter is based on the one of FIG. 1, which is extended with a test circuit 5 that controls the signal flow in the converter during the test mode. At its turn, the test circuit is controlled by commands, that are supplied to it in the form of digital codes via terminal 10. The test circuit contains a facility to decode the commands and act correspondingly. Upon reception of a command on terminal 10, the test circuit will enter the test mode. The test circuit receives a first set of analog control and analog external signals, via connections 6 and 8, respectively. By means of commands, respective analog signals from this first set are selected consecutively, and supplied to input terminal 1 through connection 11. The magnitude of each selected signal is converted to a digital data signal by the analog signal comparison means 2 and the digital conversion means 3 and outputted by the digital output facility 4. The test circuit also receives a second set of digital control signals and digital external signals, via connections 7 and 9, respectively. Upon reception of other commands on terminal 10, the test circuit will supply respective digital signals from this second set to the digital output facility 4 through connection 12. The digital output facility 4 is controlled by a clock signal. It constructs a clocked version of each selected signal. This clocked version of the signal is inserted in the digital data signal that is outputted by digital output facility 4. The timing relationship between the clock signal and the selected signal is thus contained in the digital data signal.

The testing works as follows. Tester 13 provides a number of commands to node 10 and compares the respective generated digital data signals at the digital output facility with specified data that is stored in a memory section available to the tester. The test results, e.g. a simple pass/fail notification, can be sent to an on-chip CPU which in turn informs the application. Alternatively, the tester and CPU are one and the same, with the CPU also being used for running applications. Recalling the remark made with respect to FIG. 1 that usually hardware is provided for off-chip reading out the digital output facility 4, e.g. a scan chain, it is also an option to have the tester 13 located outside the chip. Then, the commands can be supplied to node 10 via an input port of the chip.

Figure 3:
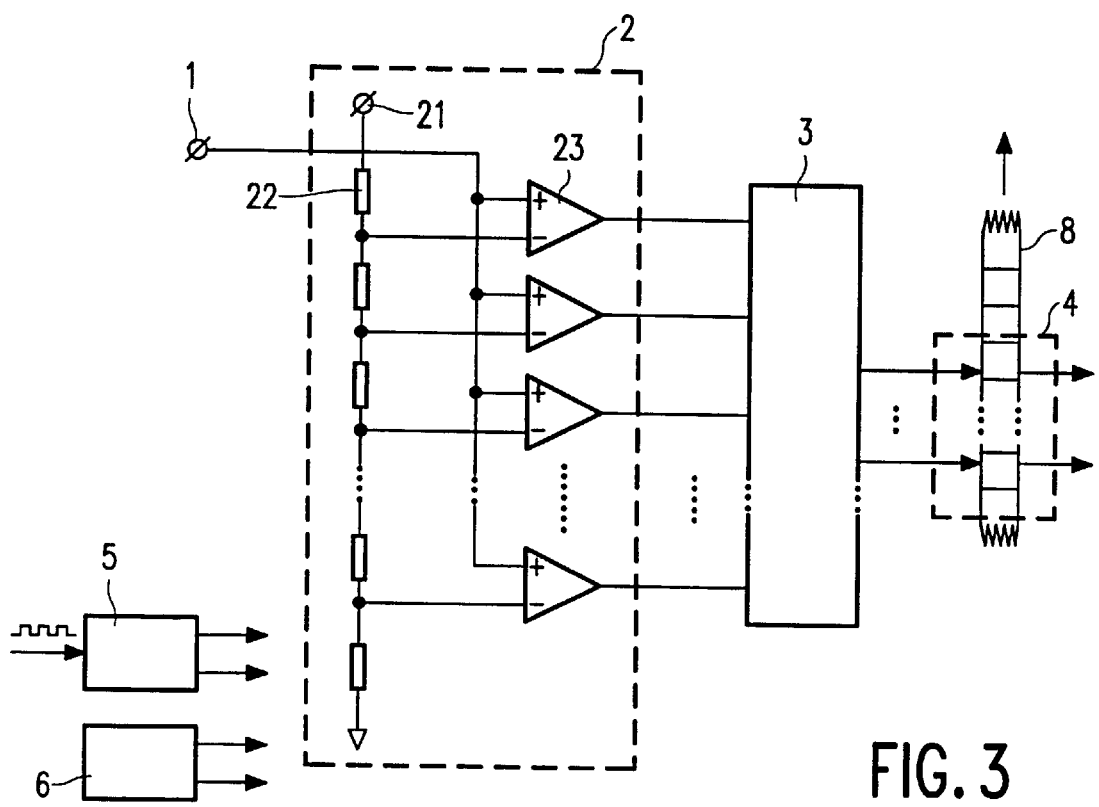
FIG. 3 shows a diagram of a full-flash A/D converter.

FIG. 3 shows a block diagram of an N-bit full-flash converter. An analog input voltage, related unambiguously to a signal of which a digital representation is to be obtained, is applied to input terminal 1. Analog signal comparison means 2 construct ($2^N-1$) reference voltages from a voltage on node 21 through a resistor divider network 22 and compare these voltages with the input voltage through a set of ($2^N-1$) comparators 23. The signals at the outputs of the comparators have two levels, respectively indicating whether the input voltage has a greater magnitude than the applied reference voltage to each comparator, or not. Each comparator in this way provides one of the ($2^N-1$) binary elements of a digital sequence, at each instant in time representing in thermometer code a magnitude of the input voltage. Digital conversion means 3 translate this sequence to an N-bit binary value, that is subsequently outputted by digital output facility 4. The converter is controlled by two internal clock signals, a first clock signal controlling the operation of the digital conversion means 3, a second clock signal controlling the operation of the digital output facility 4. Both clock signals are derived from a master clock signal by clock generator 5. The clock signals have the same period and pulse width but different relative phase, the value of which is critical for proper operation of the converter as a whole. Furthermore, two DC bias signals are generated for the set of comparators by bias generator 6. In conventional functional test schemes these internally generated clock signals and bias signals of the converter are tested implicitly, by applying a series of test signals to the input terminal 1, reading out the corresponding digital data signal at digital output facility 4, e.g. by means of a scan chain 8, and comparing that digital data signal with specified data.

Figure 4:
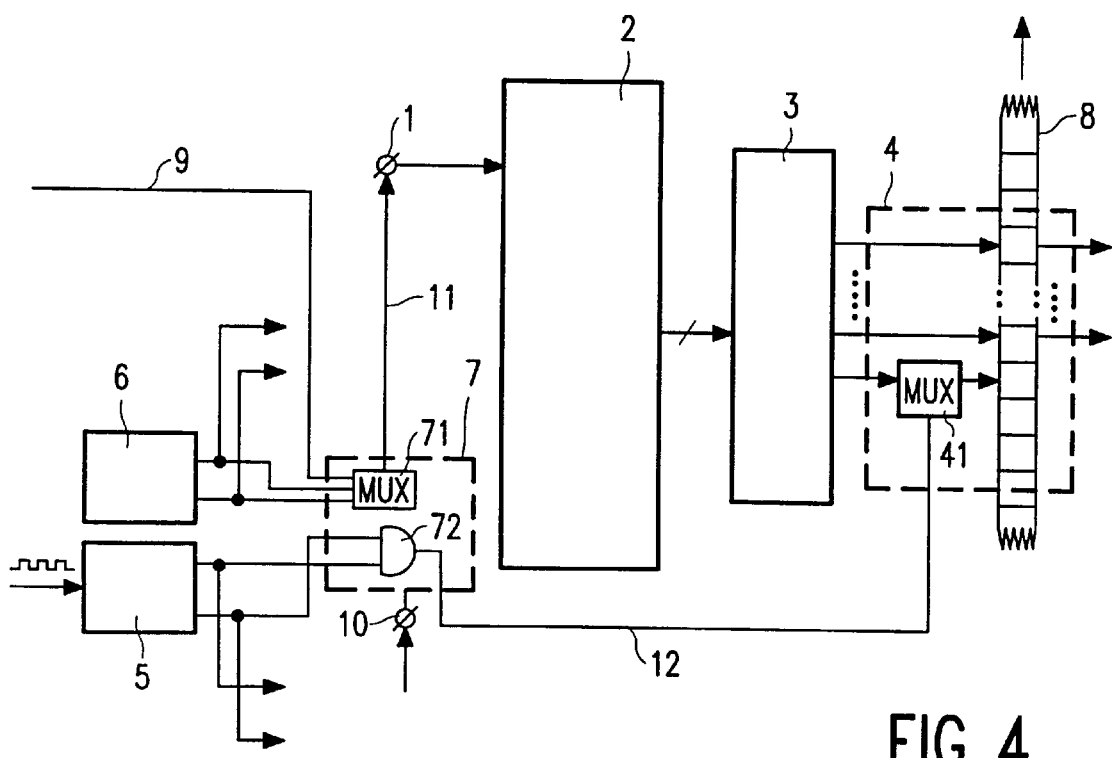
FIG. 4 shows a preferred embodiment of the invention, based on the full-flash converter of FIG. 3.

FIG. 4 is a block diagram of a preferred embodiment of the invention, based on the full-flash converter of FIG. 3, providing a way to explicitly test the control signals of that converter on-chip. The tester is not explicitly drawn. Its operation and connections can be derived from FIG. 2 and the accompanying text. To the A/D converter, a test circuit 7 is added. The test circuit includes a multiplexer 71 and control circuitry (not explicitly drawn), providing a state machine. To multiplexer 71 a number of nodes are connected, namely, two internal nodes carrying bias signals for the analog signal comparison circuit 2, generated by bias generator 6, and an external node, carrying analog external signal 9. The state machine in one state interprets the commands received on node 10 and in a subsequent state operates, amongst others, the multiplexer 71. Upon reception of a code, a corresponding one of the nodes connected to the multiplexer 71 is selected and the signal carried by it is supplied to input terminal 1 through connection 11. This signal is converted to a digital data signal by analog signal comparison means 2 and digital conversion means 3, and made available at digital output facility 4.

The two clock signals, derived from an external master clock by clock generator 5, are assumed to have a timing relationship relative to one another that is critical for the proper operation of the converter. If the design requires, for example, that the clock signals are to have a predetermined overlap, this could be evaluated in the following way. By supplying them to AND-port 72 in the test circuit a pulse train is constructed, containing the vital information on the timing relationship of the clock signals in the form of the pulse width being a measure of the amount of overlap. This pulse train is supplied to the digital output facility 4, where a clocked version of the pulse train is constructed. Multiplexer 41, operated by the control circuitry in the test circuit, selects either this signal or the digital data signal from the digital conversion means 3 to be outputted.

Using an on-chip tester, like the one in FIG. 2, the comparison can be carried out on-chip. Alternatively, digital output facility 4 in the test mode inserts the output data in the scan chain 8. Subsequently, off-chip comparison can take place of these data with specified digital data.

I claim:

1. An integrated circuit containing an A/D converter and a test circuit, the operation of said A/D converter being under control of a plurality of analog and digital control signals, one of the latter being a clock signal, said A/D converter including an input facility for receiving an analog input signal, an analog signal comparison circuit connected to the input facility which compares the analog input signal with a number of reference values and generates respective elements of a digital sequence, a digital conversion circuit connected to the analog signal comparison circuit for converting the digital sequence to a first digital data signal, and a digital output facility that is controlled by the clock signal and connected to the digital conversion circuit for outputting the first digital data signal, characterized in that said test circuit has a test mode for selecting at least one of said control signals to be supplied to one of said facilities, thus outputting a second digital data signal at the digital output facility representing the selected control signal for a subsequent test.

2. An integrated circuit as claimed in claim 1, wherein said test circuit enables selecting a first selected signal from said analog control signals, and supplying that first selected signal to the input facility, thus providing a third digital data signal at the digital output facility corresponding to an analog magnitude of the first selected signal.

3. An integrated circuit as claimed in claim 1, wherein said test circuit enables selecting a second selected signal from said digital control signals, and supplying that second selected signal to the digital output facility that is controlled by the clock signal, and thereby producing a fourth digital data signal at the digital output facility representative of the timing characteristics of the second selected signal relative to the clock signal.

4. An integrated circuit as claimed in claim 2, characterized in that the test circuit also enables selecting a third selected signal from said digital control signals, and supplying that third selected signal to the digital output facility that is controlled by the clock signal, and thereby producing a fifth digital data signal at the digital output facility representative of the timing characteristics of the third selected signal relative to the clock signal.

5. An integrated circuit as claimed in claim 2, wherein the test circuit enables selecting an analog external signal, carried by a node external to the converter, and supplying that analog external signal to the input facility, thereby producing a sixth digital data signal at the digital output facility representative of an analog magnitude of the analog external signal relative to the clock signal.

6. An integrated circuit as claimed in claim 3, wherein the test circuit enables selecting a digital external signal, carried by a node external to the converter, and supplying that digital external signal to the digital output facility that is controlled by the clock signal, thereby producing a seventh digital data signal at the digital output facility representative of the timing characteristics of the digital external signal relative to the clock signal.

7. An integrated circuit as claimed in claim 3, wherein the test circuit includes a multiple input logic circuit for at once receiving a subset of the digital control signals, rendering one pulse train at the output of the logic circuit containing required timing information of the subset, the test circuit enabling selection of that pulse train for transfer to the digital output facility that is controlled by the clock, and thereby producing an eighth digital data signal at the digital output facility representative of the relative timing characteristics of the subset.

8. An integrated circuit as claimed in claim 6, wherein the test circuit includes a multiple input logic circuit for at once receiving a subset of the digital control signals and the digital external signals, rendering one pulse train at the output of the logic circuit containing required timing information of the subset, the test circuit enabling selection of that pulse train for transfer to the digital output facility that is controlled by the clock, and thereby producing a ninth digital data signal at the digital output facility representative of the relative timing characteristics of the subset.

9. An integrated circuit as claimed in claim 1, the test circuit containing a selection device for selecting modes of operation of the A/D converter under control of respective receiving commands in the form of digital codes, a first mode being normal operation mode of the A/D converter and a second mode being said test mode.

10. An integrated circuit as claimed in claim 9, wherein said selection device also select signals to be tested among said analog and digital control signals and analog and digital external signals, upon reception of respective commands.

11. A method for testing an integrated circuit comprising an A/D converter and a test circuit, characterized in:
(1) providing a first control input for receiving a digital control signal for the A/D converter and a second control input for receiving an analog control signal for the A/D converter;
(2) under control of the test circuit selecting a digital or analog control signal to be tested from the first and second control inputs;

(3) feeding a selected analog control signal to an input of the A/D converter or a selected digital control signal to the output of the A/D converter and;

(4) comparing an output signal of the A/D converter corresponding to the control signal fed to the A/D converter with a reference signal.

12. An integrated circuit containing an A/D converter and a test circuit, the operation of said A/D converter being under control of a plurality of analog and digital control signals, one of the latter being a clock signal, said A/D converter including an input facility for receiving an analog input signal, analog signal comparison means connected to the input facility for comparing the analog input signal with a number of reference values and thus generating respective elements of a digital sequence, digital conversion means connected to the analog signal comparison means for converting the digital sequence to a first digital data signal, and a digital output facility that is controlled by the clock signal and connected to the digital conversion means for outputting the first digital data signal, characterized in that said test circuit has a test mode for selecting at least one of said control signals to be supplied to one of said facilities, thus outputting a second digital data signal at the digital output facility representing the selected control signal for a subsequent test.

13. An integrated circuit, comprising:

an analog-to-digital converter having a data input and a data output, said converter converting an analog signal received at said data input to a digital data signal output at said data output;

control inputs which receive at least an analog control signal and a digital control signal, each control signal controlling operation of said analog-to-digital converter; and a test circuit which selectively couples the analog control signal to said data input of said analog-to-digital converter and said digital control signal to said data output of said analog to digital converter.

14. An integrated circuit according to claim 13, wherein said test circuit includes a test control input which receives a test control signal that controls the respective coupling of the analog and digital control signals to said data input and data output of said analog-to-digital converter.

15. An integrated circuit according to claim 13, wherein said data output of said analog-to-digital converter receives a clock signal which clocks the digital data output of said analog-to-digital converter.

16. An integrated circuit according to claim 15, wherein said test circuit compares said digital data output, corresponding to the selected one of the analog and digital control signals, to a reference signal.

17. An integrated circuit according to claim 13, wherein said test circuit compares said digital data output, corresponding to the selected one of the analog and digital control signals, to a reference signal.

* * * * *